(12) United States Patent
Geurts

(10) Patent No.: US 10,756,129 B2
(45) Date of Patent: Aug. 25, 2020

(54) IMAGE SENSORS HAVING IMAGING PIXELS WITH RING-SHAPED GATES

(71) Applicant: SEMICONDUCTOR COMPONENTS INDUSTRIES, LLC, Phoenix, AZ (US)

(72) Inventor: Tomas Geurts, Haasrode (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/244,250

(22) Filed: Jan. 10, 2019

(65) Prior Publication Data
US 2020/0227454 A1 Jul. 16, 2020

(51) Int. Cl.
*H01L 27/146* (2006.01)
*H04N 5/355* (2011.01)

(52) U.S. Cl.
CPC .. *H01L 27/14614* (2013.01); *H01L 27/14603* (2013.01); *H04N 5/3559* (2013.01)

(58) Field of Classification Search
CPC ......... H01L 27/14614; H01L 27/14603; H01L 27/14609; H01L 27/14636; H01L 27/1461; H01L 27/14612; H01L 27/14645; H04N 5/3559; H04N 5/3597; H04N 5/37452; H04N 5/35554; H04N 5/35581; H04N 5/3577; H04N 5/378
See application file for complete search history.

(56) References Cited

U.S. PATENT DOCUMENTS

| | | |
|---|---|---|
| 2013/0032697 A1 | 2/2013 | De Wit |
| 2017/0099423 A1 | 4/2017 | Cremers et al. |
| 2017/0099446 A1 | 4/2017 | Cremers et al. |
| 2017/0170223 A1 | 6/2017 | Hynecek et al. |
| 2017/0244921 A1 | 8/2017 | Velichko |
| 2017/0324917 A1 | 11/2017 | Mlinar et al. |
| 2017/0358617 A1 | 12/2017 | Tekleab et al. |
| 2018/0115730 A1 | 4/2018 | Velichko |

OTHER PUBLICATIONS

De Wit et al., "A Common Gate Pinned Photodiode Pixel"; International Image Sensor Society, Index of Past Workshops. 2011.

*Primary Examiner* — Selim U Ahmed
(74) *Attorney, Agent, or Firm* — Treyz Law Group, P.C.; Joseph F. Guihan

(57) ABSTRACT

An image sensor may include a plurality of imaging pixels with high dynamic range. Each imaging pixel may have a photodiode, a floating diffusion region, and a transfer transistor configured to transfer charge from the photodiode to the floating diffusion region. Each imaging pixel may also include an overflow capacitor and an overflow transistor interposed between the photodiode and the overflow capacitor. A dual conversion gain transistor may be interposed between the overflow capacitor and the floating diffusion region. To reduce noise associated with operation of the pixel, a ring-shaped conductive layer may form a gate for both the overflow transistor and the dual conversion gain transistor. This common gate may be set to an intermediate level during integration to allow charge to overflow past the overflow transistor to the overflow capacitor. The common gate may also be used to assert the dual conversion gain transistor.

19 Claims, 9 Drawing Sheets

IMAGE SENSORS HAVING IMAGING PIXELS WITH RING-SHAPED GATES

BACKGROUND

This relates generally to image sensors, and more specifically, to image sensors configured to produce high dynamic range (HDR) images.

Modern electronic devices such a cellular telephones, cameras, and computers often use digital image sensors. Imagers (i.e., image sensors) are formed from a two-dimensional array of image sensing pixels. Each pixel may include a photosensor such as a photodiode that receives incident photons (light) and converts the photons into electrical charges. Conventional image pixel arrays include frontside illuminated image pixels or backside illuminated image pixels. The image sensors may include photodiodes and other operational circuitry such as transistors formed in a front surface of the substrate. A single image sensing pixel in the two-dimensional array of image sensing pixels includes a single photosensitive region, a color filter formed over the photosensitive region, and a single dome-shaped micro-lens formed over the color filter.

Conventional imaging systems may have images with artifacts associated with low dynamic range. Scenes with bright and dark portions may produce artifacts in conventional image sensors, as portions of the image may be over exposed or under exposed. Conventional imaging systems may also have a lower signal-to-noise ratio than desired.

It would therefore be desirable to provide image sensors having improved dynamic range with reduced noise.

DETAILED DESCRIPTION

Embodiments of the present invention relate to image sensors. It will be recognized by one skilled in the art that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices may include image sensors that gather incoming light to capture an image. The image sensors may include arrays of pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the pixels and readout circuitry for reading out image signals corresponding to the electric charge generated by the photosensitive elements.

Figure 1:
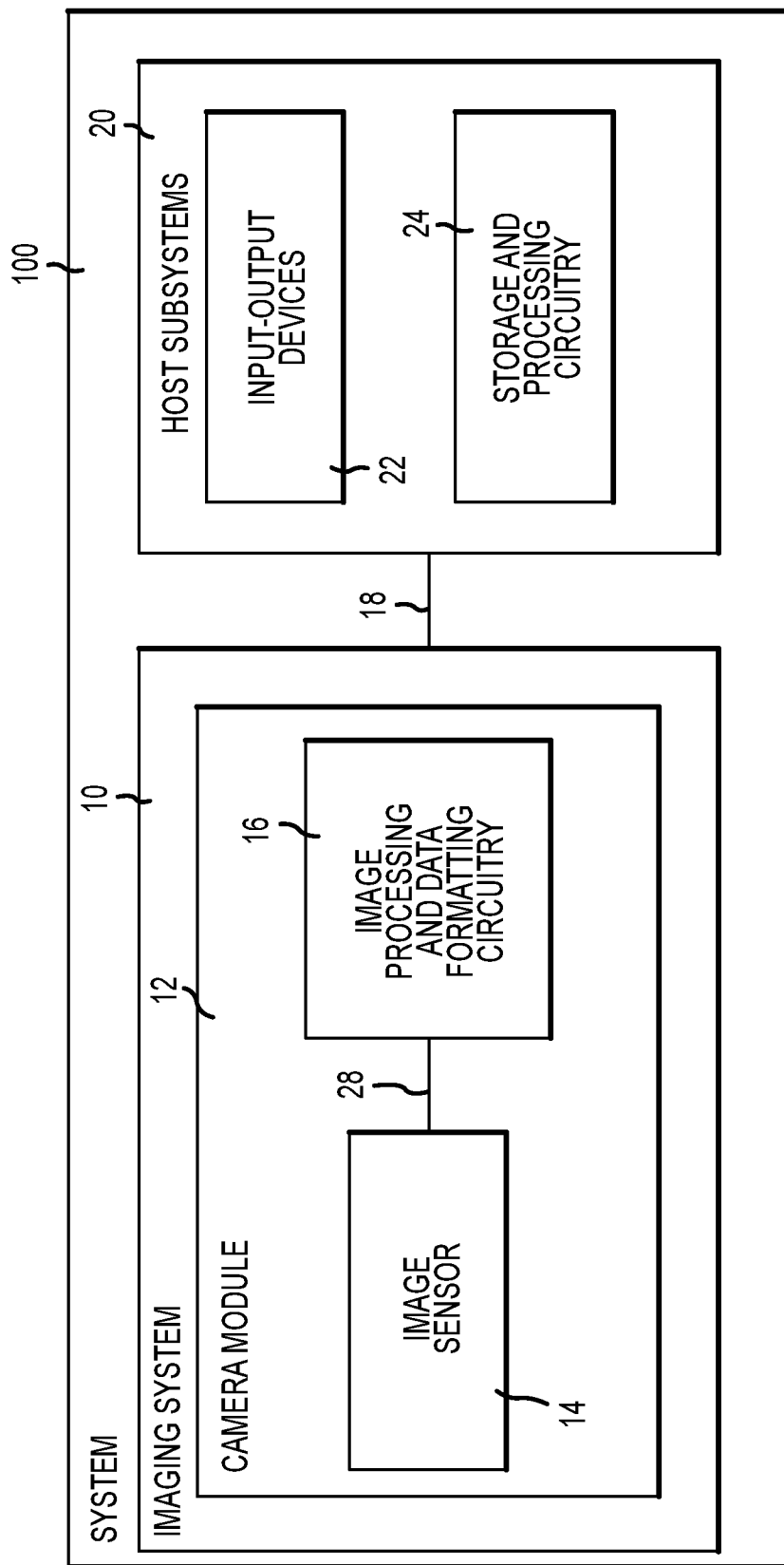
FIG. 1 is a diagram of an illustrative electronic device having an image sensor in accordance with an embodiment.

FIG. 1 is a diagram of an illustrative imaging and response system including an imaging system that uses an image sensor to capture images. System 100 of FIG. 1 may be an electronic device such as a camera, a cellular telephone, a video camera, or other electronic device that captures digital image data, may be a vehicle safety system (e.g., an active braking system or other vehicle safety system), or may be a surveillance system.

As shown in FIG. 1, system 100 may include an imaging system such as imaging system 10 and host subsystems such as host subsystem 20. Imaging system 10 may include camera module 12. Camera module 12 may include one or more image sensors 14 and one or more lenses.

Each image sensor in camera module 12 may be identical or there may be different types of image sensors in a given image sensor array integrated circuit. During image capture operations, each lens may focus light onto an associated image sensor 14 (such as the image sensor of FIG. 2). Image sensor 14 may include photosensitive elements (i.e., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital converter circuitry, data output circuitry, memory (e.g., buffer circuitry), address circuitry, etc.

Still and video image data from camera sensor 14 may be provided to image processing and data formatting circuitry 16 via path 28. Image processing and data formatting circuitry 16 may be used to perform image processing functions such as data formatting, adjusting white balance and exposure, implementing video image stabilization, face detection, etc. Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common semiconductor substrate (e.g., a common silicon image sensor integrated circuit die). If desired, camera sensor 14 and image processing circuitry 16 may be formed on separate semiconductor substrates. For example, camera sensor 14 and image processing circuitry 16 may be formed on separate substrates that have been stacked.

Imaging system 10 (e.g., image processing and data formatting circuitry 16) may convey acquired image data to host subsystem 20 over path 18. Host subsystem 20 may include processing software for detecting objects in images, detecting motion of objects between image frames, determining distances to objects in images, filtering or otherwise processing images provided by imaging system 10.

If desired, system 100 may provide a user with numerous high-level functions. In a computer or advanced cellular telephone, for example, a user may be provided with the ability to run user applications. To implement these functions, host subsystem 20 of system 100 may have input-output devices 22 such as keypads, input-output ports, joysticks, and displays and storage and processing circuitry 24. Storage and processing circuitry 24 may include volatile and nonvolatile memory (e.g., random-access memory, flash memory, hard drives, solid-state drives, etc.). Storage and processing circuitry 24 may also include microprocessors, microcontrollers, digital signal processors, application specific integrated circuits, etc.

Figure 2:
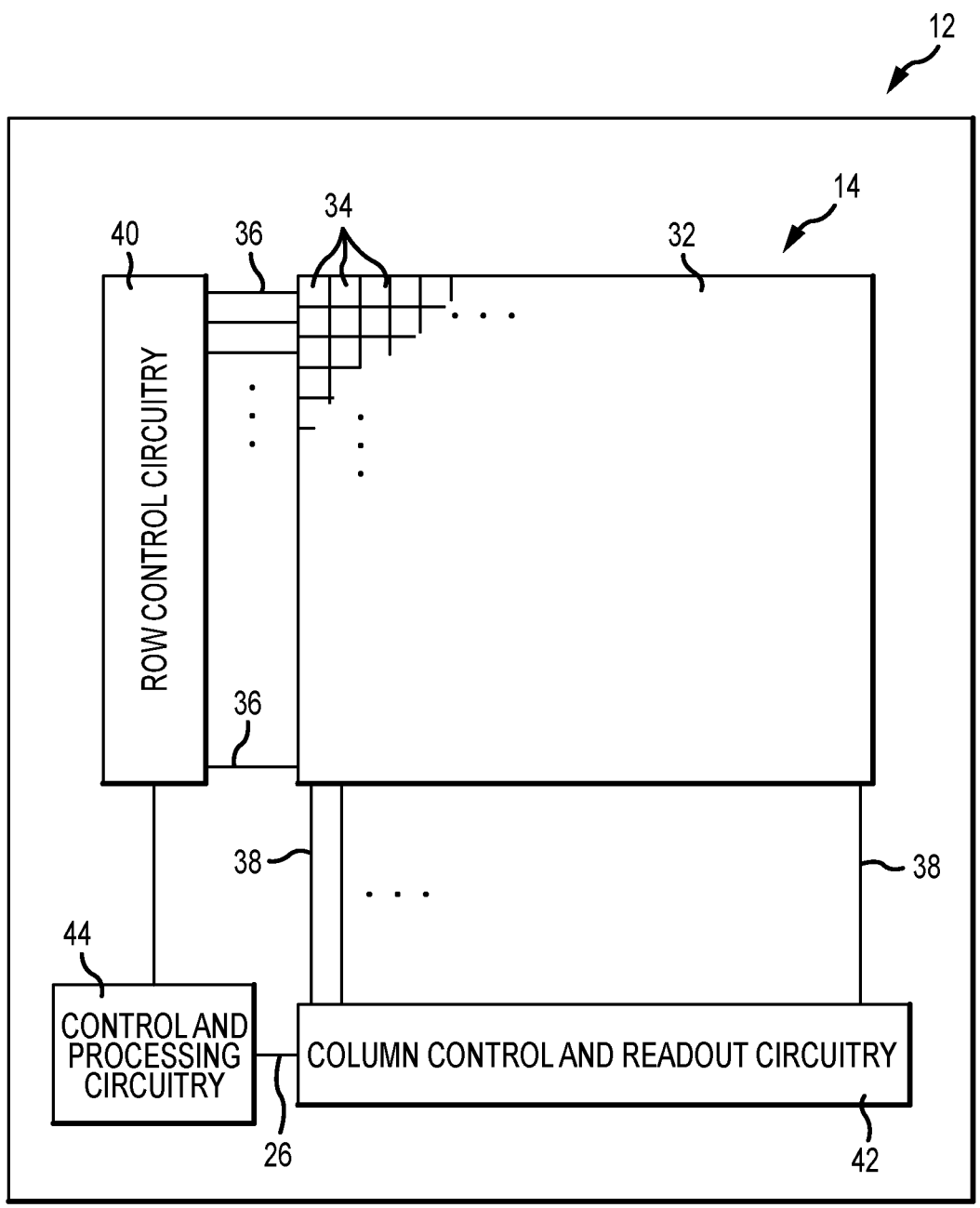
FIG. 2 is a diagram of an illustrative pixel array and associated readout circuitry for reading out image signals in an image sensor in accordance with an embodiment.

An example of an arrangement for camera module 12 of FIG. 1 is shown in FIG. 2. As shown in FIG. 2, camera module 12 includes image sensor 14 and control and processing circuitry 44. Control and processing circuitry 44 may correspond to image processing and data formatting circuitry 16 in FIG. 1. Image sensor 14 may include a pixel array such as array 32 of pixels 34 (sometimes referred to herein as image sensor pixels, imaging pixels, or image pixels 34) and may also include control circuitry 40 and 42. Control and processing circuitry 44 may be coupled to row control circuitry 40 and may be coupled to column control and readout circuitry 42 via data path 26. Row control circuitry 40 may receive row addresses from control and processing circuitry 44 and may supply corresponding row control signals to image pixels 34 over control paths 36 (e.g., dual conversion gain control signals, pixel reset control signals, charge transfer control signals, blooming control signals, row select control signals, or any other desired pixel control signals). Control paths 36 may also sometimes be referred to as row lines 36, control lines 36, row control signal lines, etc. Column control and readout circuitry 42 may be coupled to the columns of pixel array 32 via one or more conductive lines such as column lines 38. Column lines 38 may be coupled to each column of image pixels 34 in image pixel array 32 (e.g., each column of pixels may be coupled to a corresponding column line 38). Column lines 38 may be used for reading out image signals from image pixels 34 and for supplying bias signals (e.g., bias currents or bias voltages) to image pixels 34. During image pixel readout operations, a pixel row in image pixel array 32 may be selected using row control circuitry 40 and image data associated with image pixels 34 of that pixel row may be read out by column control and readout circuitry 42 on column lines 38.

Column control and readout circuitry 42 may include column circuitry such as column amplifiers for amplifying signals read out from array 32, sample and hold circuitry for sampling and storing signals read out from array 32, analog-to-digital converter circuits for converting read out analog signals to corresponding digital signals, and column memory for storing the read out signals and any other desired data. Column control and readout circuitry 42 may output digital pixel values to control and processing circuitry 44 over line 26.

Array 32 may have any number of rows and columns. In general, the size of array 32 and the number of rows and columns in array 32 will depend on the particular implementation of image sensor 14. While rows and columns are generally described herein as being horizontal and vertical, respectively, rows and columns may refer to any grid-like structure (e.g., features described herein as rows may be arranged vertically and features described herein as columns may be arranged horizontally).

Pixel array 32 may be provided with a color filter array having multiple color filter elements, which allows a single image sensor to sample light of different colors. As an example, image sensor pixels such as the image pixels in array 32 may be provided with a color filter array that allows a single image sensor to sample red, green, and blue (RGB) light using corresponding red, green, and blue image sensor pixels arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. In another suitable example, the green pixels in a Bayer pattern are replaced by broadband image pixels having broadband color filter elements (e.g., clear color filter elements, yellow color filter elements, etc.). These examples are merely illustrative and, in general, color filter elements of any desired color and in any desired pattern may be formed over any desired number of image pixels 34.

If desired, array 32 may be part of a stacked-die arrangement in which pixels 34 of array 32 are split between two or more stacked substrates. In such an arrangement, each of the pixels 34 in the array 32 may be split between the two dies at any desired node within the pixel. As an example, a node such as the floating diffusion node may be formed across two dies. Pixel circuitry that includes the photodiode and the circuitry coupled between the photodiode and the desired node (such as the floating diffusion node, in the present example) may be formed on a first die, and the remaining pixel circuitry may be formed on a second die. The desired node may be formed on (i.e., as a part of) a coupling structure (such as a conductive pad, a micro-pad, a conductive interconnect structure, or a conductive via) that connects the two dies. Before the two dies are bonded, the coupling structure may have a first portion on the first die and may have a second portion on the second die. The first die and the second die may be bonded to each other such that first portion of the coupling structure and the second portion of the coupling structure are bonded together and are electrically coupled. If desired, the first and second portions of the coupling structure may be compression bonded to each other. However, this is merely illustrative. If desired, the first and second portions of the coupling structures formed on the respective first and second dies may be bonded together using any metal-to-metal bonding technique, such as soldering or welding.

As mentioned above, the desired node in the pixel circuit that is split across the two dies may be a floating diffusion node. Alternatively, the desired node in the pixel circuit that is split across the two dies may be the node between a floating diffusion region and the gate of a source follower transistor (i.e., the floating diffusion node may be formed on the first die on which the photodiode is formed, while the coupling structure may connect the floating diffusion node to the source follower transistor on the second die), the node between a floating diffusion region and a source-drain node of a transfer transistor (i.e., the floating diffusion node may be formed on the second die on which the photodiode is not located), the node between a source-drain node of a source-follower transistor and a row select transistor, or any other desired node of the pixel circuit.

In general, array 32, row control circuitry 40, column control and readout circuitry 42, and control and processing circuitry 44 may be split between two or more stacked substrates. In one example, array 32 may be formed in a first substrate and row control circuitry 40, column control and readout circuitry 42, and control and processing circuitry 44 may be formed in a second substrate. In another example, array 32 may be split between first and second substrates (using one of the pixel splitting schemes described above) and row control circuitry 40, column control and readout circuitry 42, and control and processing circuitry 44 may be formed in a third substrate.

Figure 3A:
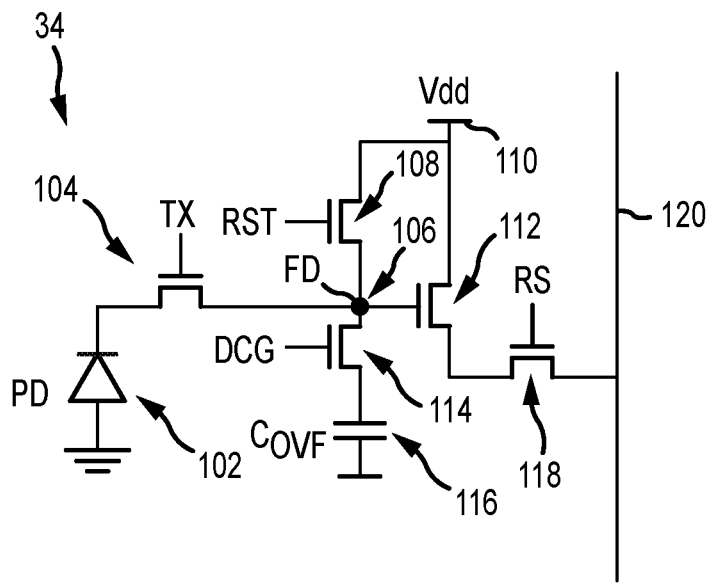
FIG. 3A is a circuit diagram of an illustrative imaging pixel having a dual conversion gain transistor and an overflow capacitor in accordance with an embodiment.

An illustrative imaging pixel that may be included in image sensor 14 is shown in FIG. 3A. As shown in FIG. 3A, imaging pixel 34 may include a photosensitive area such as photodiode 102. Photodiode 102 may generate charge in response to incident light. The amount of charge generated is proportional to the intensity of the incident light and the amount of time the photodiode is exposed to the incident light. Photodiode 102 has a first terminal coupled to ground and a second terminal coupled to floating diffusion region 106 through transfer transistor 104. A reset transistor 108 may be coupled between floating diffusion region 106 and a bias voltage supply terminal 110. Reset transistor 108 may be asserted during operation of the pixel to reset the floating diffusion region to a reset voltage.

A dual conversion gain transistor 114 may be coupled between floating diffusion region 106 and a storage capacitor 116. Floating diffusion region 106 may be coupled to a gate of source follower transistor 112. Source follower transistor may be coupled between bias voltage supply terminal 110 and row select transistor 118. Row select transistor 118 may be coupled between source follower transistor 112 and column output line 120. Row select transistor 118 may be asserted to sample the charge on the floating diffusion to column output line 120 (e.g., $V_{OUT}$ may be provided to column output line 120).

Transfer transistor 104 may have a gate that receives transfer transistor control signal TX (sometimes referred to as transfer signal TX). Reset transistor 108 may have a gate that receives reset transistor control signal RST (sometimes referred to as reset signal RST). Dual conversion gain transistor 114 may have a gate that receives dual conversion gain transistor control signal DCG (sometimes referred to as dual conversion gain signal DCG). Row select transistor 118 may have a gate that receives row select transistor control signal RS (sometimes referred to as row select signal RS). Control signals TX, DCG, RST, RS may be provided by row control circuitry (e.g., row control circuitry 40 in FIG. 2) over control paths (e.g., control paths 36 in FIG. 2).

In this application, each transistor is illustrated as having three terminals: a source, a drain, and a gate. The source and drain terminals of each transistor may be changed depending on how the transistors are biased and the type of transistor used. For the sake of simplicity, the source and drain terminals are referred to herein as source-drain terminals or simply terminals.

During operation of pixel 34, photodiode 102 may be reset to start an integration time. Photodiode 102 may be reset by asserting transfer transistor 104 and reset transistor 108, for example. Resetting photodiode 102 may begin the integration time for pixel 34. During the integration time, photodiode 102 generates charge in response to incident light. The photodiode may only be able to accumulate a certain amount of charge before saturating. Therefore, to increase the dynamic range of the pixel, pixel 34 may be configured to allow charge to overflow from photodiode. The overflow charge may be stored and later sampled. For example, transfer signal TX may be set to an intermediate level to allow charge over a certain threshold to overflow from photodiode 102 to floating diffusion region 106. When the integration time has concluded, the overflow charge may be sampled from the floating diffusion region 106 or stored in overflow capacitor 116 for subsequent sampling. Upon conclusion of the integration time, transfer transistor 104 may be asserted to transfer all remaining accumulated charge (e.g., non-overflow charge) in the photodiode 102 to the floating diffusion region 106. This charge may then also be sampled. The overflow charge sample and the non-overflow charge sample may be used by processing circuitry to determine a single representative signal for the imaging pixel.

Dual conversion gain transistor 114 and capacitor 116 may be used by pixel 34 to implement different dual conversion gain modes. In particular, pixel 34 may be operable in a high conversion gain mode and in a low conversion gain mode. If dual conversion gain transistor 114 is disabled, pixel 34 will be placed in a high conversion gain mode. If dual conversion gain transistor 114 is enabled, pixel 34 will be placed in a low conversion gain mode. When dual conversion gain transistor 114 is turned on, the capacitor 116 may be switched into use to provide floating diffusion region 106 with additional capacitance. This results in lower conversion gain for pixel 34. When dual conversion gain transistor 114 is turned off, the additional loading of the capacitor is removed and the pixel reverts to a relatively higher pixel conversion gain configuration. Each sample of floating diffusion 106 (e.g., the overflow charge sampling, the non-overflow charge sampling, reset voltage sampling) may be performed in either the low conversion gain mode or the high conversion gain mode.

In FIG. 3A, both reset transistor 108 and dual conversion gain transistor 114 are coupled to floating diffusion region 106. This provides two different leakage sources that may vary between pixels. Therefore, an image sensor that includes pixels of the type shown in FIG. 3A may have higher than desired dark signal non-uniformity (DSNU), particularly at high temperatures. An arrangement of a pixel with improved noise and high dynamic range is shown in FIG. 3B.

Figure 3B:
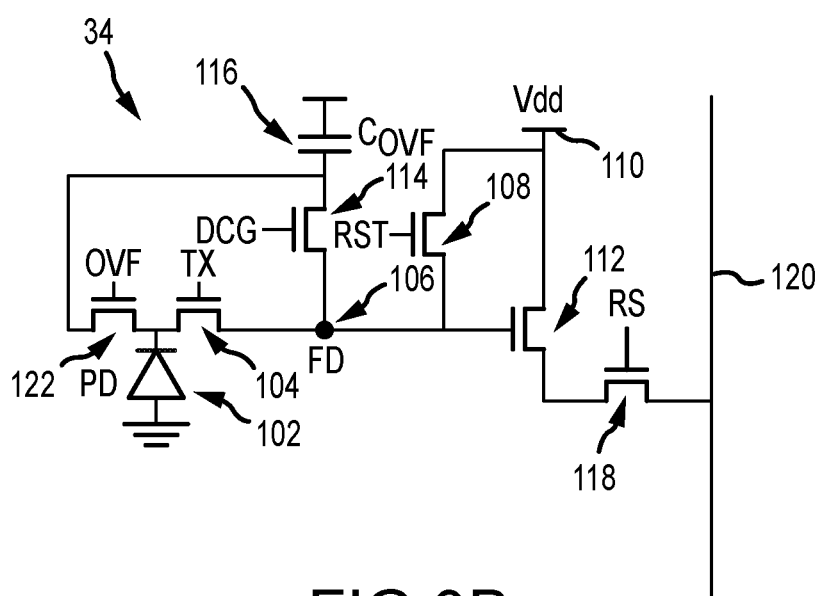
FIG. 3B is a circuit diagram of an illustrative imaging pixel having a dual conversion gain transistor and an overflow transistor in accordance with an embodiment.

As shown in FIG. 3B, imaging pixel 34 includes a photodiode 102. Similar to as in FIG. 3A, photodiode 102 has a first terminal coupled to ground and a second terminal. The second terminal is coupled to floating diffusion region 106 through transfer transistor 104. A reset transistor 108 may be coupled between floating diffusion region 106 and bias voltage supply terminal 110. Reset transistor 108 may be asserted during operation of the pixel to reset the floating diffusion region to a reset voltage.

A dual conversion gain transistor 114 may be coupled between floating diffusion region 106 and capacitor 116 (sometimes referred to as overflow capacitor $C_{OVF}$). Floating diffusion region 106 may be coupled to a gate of source follower transistor 112. Source follower transistor may be coupled between bias voltage supply terminal 110 and row select transistor 118. Row select transistor 118 may be coupled between source follower transistor 112 and column output line 120. Row select transistor 118 may be asserted to sample the charge on floating diffusion to column output line 120 (e.g., $V_{OUT}$ may be provided to column output line 120).

To reduce fixed pattern noise in pixel 34, the pixel of FIG. 3B includes an overflow transistor 122 that is coupled between the second terminal of photodiode 102 and overflow capacitor 116. By having transistor 122 be coupled directly between photodiode 102 and overflow capacitor 116, noise resulting from overflow charge leaking from the floating diffusion 114 (as in FIG. 3A) may be reduced.

Transfer transistor 104 may have a gate that receives transfer transistor control signal TX. Reset transistor 108 may have a gate that receives reset transistor control signal RST. Dual conversion gain transistor 114 may have a gate that receives dual conversion gain transistor control signal DCG. Overflow transistor 122 may have a common gate that receives an overflow transistor control signal OVF. Row select transistor 118 may have a gate that receives row select transistor control signal RS (sometimes referred to as row select signal RS). Control signals TX, OVF, DCG, RST, RS may be provided by row control circuitry (e.g., row control circuitry 40 in FIG. 2) over control paths (e.g., control paths 36 in FIG. 2).

Figure 4:
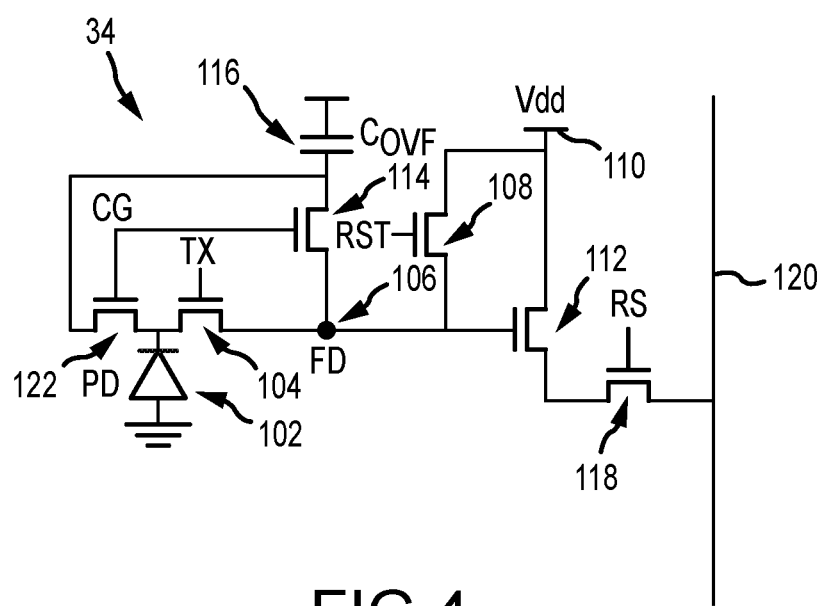
FIG. 4 is a circuit diagram of an illustrative imaging pixel having a common gate for a dual conversion gain transistor and an overflow transistor in accordance with an embodiment.

To further reduce fixed pattern noise in operation of the pixel, dual conversion gain transistor 114 and overflow transistor 122 may share a common, ring-shaped gate that prevents leakage. An embodiment of this type is shown in FIG. 4. As shown in FIG. 4, imaging pixel 34 includes a photodiode 102. Similar to as in FIG. 3A, photodiode 102 has a first terminal coupled to ground and a second terminal. The second terminal is coupled to floating diffusion region 106 through transfer transistor 104. A reset transistor 108 may be coupled between floating diffusion region 106 and bias voltage supply terminal 110. Reset transistor 108 may be asserted during operation of the pixel to reset the floating diffusion region to a reset voltage.

A dual conversion gain transistor 114 may be coupled between floating diffusion region 106 and capacitor 116 (sometimes referred to as overflow capacitor $C_{OVF}$). Floating diffusion region 106 may be coupled to a gate of source follower transistor 112. Source follower transistor may be coupled between bias voltage supply terminal 110 and row select transistor 118. Row select transistor 118 may be coupled between source follower transistor 112 and column output line 120. Row select transistor 118 may be asserted to sample the charge on floating diffusion to column output line 120 (e.g., $V_{OUT}$ may be provided to column output line 120).

To reduce noise in pixel 34, the pixel of FIG. 3B includes an overflow transistor 122 that is coupled between the second terminal of photodiode 102 and overflow capacitor 116. By having transistor 122 be coupled directly between photodiode 102 and overflow capacitor 116, noise resulting from overflow charge leaking from the floating diffusion 114 (as in FIG. 3A) may be reduced. Additionally, dual conversion gain transistor 114 and overflow transistor 122 may share a common, ring-shaped gate that prevents leakage.

As shown in FIG. 4, transfer transistor 104 may have a gate that receives transfer transistor control signal TX. Reset transistor 108 may have a gate that receives reset transistor control signal RST. Dual conversion gain transistor 114 and overflow transistor 122 may have a common gate that receives common gate control signal CG. Row select transistor 118 may have a gate that receives row select transistor control signal RS (sometimes referred to as row select signal RS). Control signals TX, CG, RST, RS may be provided by row control circuitry (e.g., row control circuitry 40 in FIG. 2) over control paths (e.g., control paths 36 in FIG. 2).

During operation of pixel 34, photodiode 102 may be reset to start an integration time. Photodiode 102 may be reset by asserting transfer transistor 104 and reset transistor 108, for example. Resetting photodiode 102 may begin the integration time for pixel 34. In order to reset the overflow capacitor, the common gate may also be asserted. During the integration time, photodiode 102 generates charge in response to incident light. The photodiode may only be able to accumulate a certain amount of charge before saturating. Therefore, to increase the dynamic range of the pixel, pixel 34 may be configured to allow charge to overflow from photodiode. The overflow charge may be stored and later sampled. For example, common gate CG may be set to an intermediate value to allow charge over a certain threshold to overflow from photodiode 102 to overflow capacitor $C_{OVF}$ through overflow transistor 122. When the integration time has concluded, the overflow charge may be sampled. Upon conclusion of the integration time, after resetting the floating diffusion region 106 by toggling reset transistor 108 on and off and reading the floating diffusion reset value, transfer transistor 104 may be asserted to transfer all remaining accumulated charge (e.g., non-overflow charge) in the photodiode 102 to the floating diffusion region 106. This charge may also be sampled. The overflow charge sample and the non-overflow charge sample may be used by processing circuitry to determine a single representative signal for the imaging pixel. Each sample of floating diffusion 106 (e.g., the overflow charge sampling, the non-overflow charge sampling, reset voltage sampling) may be performed in either the low conversion gain mode (with transistor 114 asserted) or the high conversion gain mode (with transistor 114 deasserted).

The imaging pixel of FIG. 4 may be split between two or more stacked substrates. In such an arrangement, pixel 34 may be split between the two dies at any desired node(s) within the pixel. For example, a conductive interconnect layer may be interposed between transfer transistor 104 and floating diffusion region 106, between overflow capacitor 116 and dual conversion gain transistor 114, and/or between source follower transistor 112 and row select transistor 118. In one illustrative embodiment, photodiode 102, overflow transistor 122, transfer transistor 104, and dual conversion gain transistor 114 may be formed in a first substrate and capacitor 116, floating diffusion region 106, reset transistor 108, source follower transistor 112 and row select transistor 118 may be formed in a second substrate.

Figure 5:
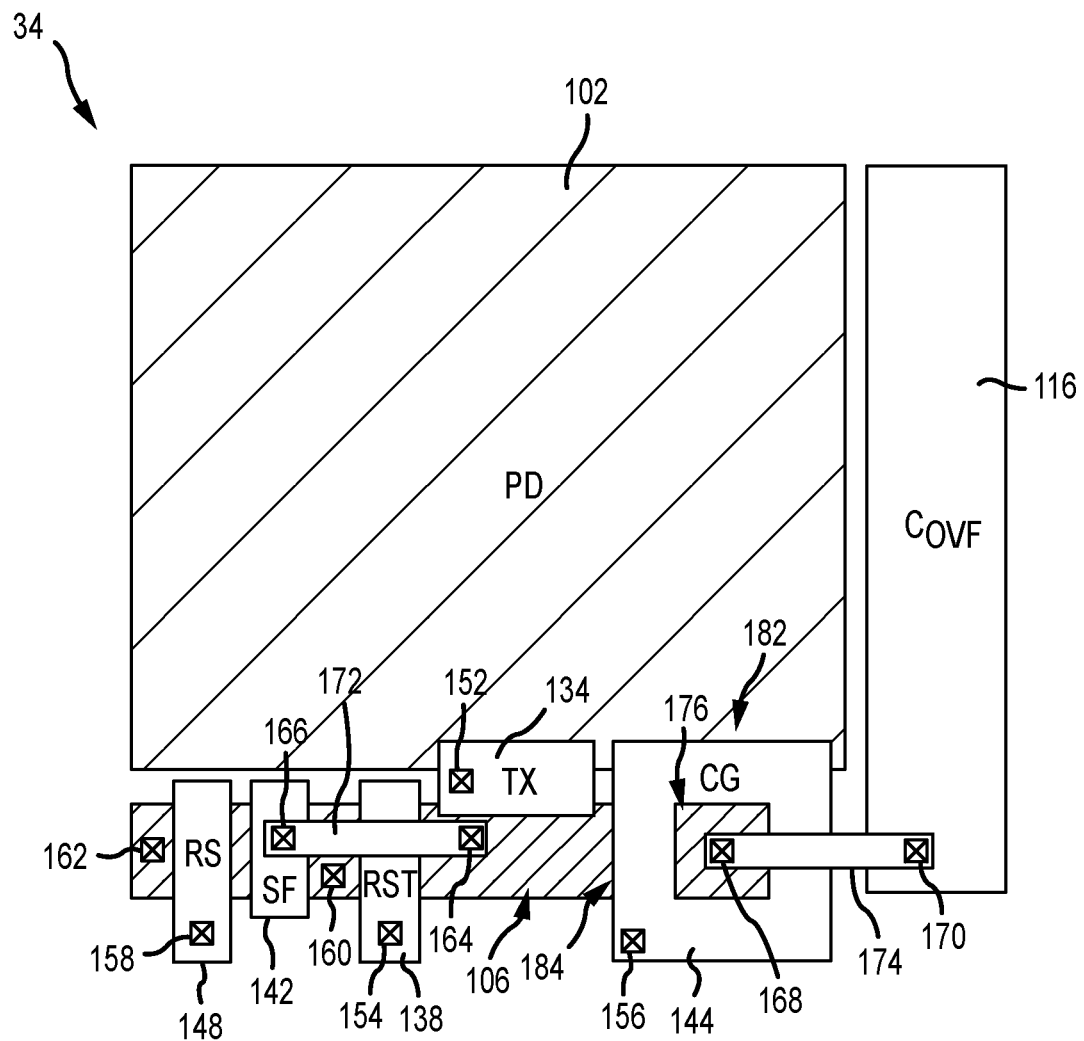
FIG. 5 is a top view of the illustrative imaging pixel of FIG. 4 showing how the common gate may be ring-shaped in accordance with an embodiment.

FIG. 5 is a top view of an illustrative imaging pixel of the type shown in FIG. 4. As shown in FIG. 5, the imaging pixel includes a photodiode 102. Photodiode 102 may be formed by a doped portion of a semiconductor substrate, for example. The transfer transistor may include a transfer gate 134 that is configured to transfer charge from photodiode 102 to floating diffusion region 106. The floating diffusion region 106 may be formed from another doped portion of the semiconductor substrate, for example. The transfer gate may be formed on the semiconductor substrate and overlap the photodiode and floating diffusion region. Various transistor gates may be described herein as overlapping the semiconductor substrate and components within the semiconductor substrate (e.g., a photodiode, floating diffusion region, etc.). It should be understood that, when the pixels are backside illuminated imaging pixels, the transistor gates may actually be formed underneath the semiconductor substrate. However, for simplicity, herein the transistors may be described as overlapping the semiconductor regardless of on which side of the semiconductor they are formed.

A contact 152 may couple transfer gate 134 to transfer control signal TX. A conductive layer 172 (e.g., a metal wire) may couple contact 164 at floating diffusion 106 to contact 166 on the gate 142 of the source follower transistor (SF). A reset gate 138 for reset transistor 108 may also be formed on the substrate. Reset gate 138 may have a contact 154 coupled to reset signal RST. When asserted, the reset transistor may couple floating diffusion region 106 to bias voltage supply terminal contact 160 (sometimes referred to as $V_{DD}$ contact). A gate 148 for row select transistor 118 may also be formed on the substrate. Gate 148 may have a contact 158 that is coupled to row select signal RS. When asserted, the row select transistor may couple a terminal of the source follower transistor to output contact 162. Output contact 162 may be coupled to column output line 120.

Pixel 34 also includes a common gate 144 that completely laterally surrounds a portion 176 of the substrate. Common gate 144 may sometimes be described herein as a ring-shaped gate, a circular gate, an annular gate, a ring-shaped conductive layer, a circular conductive layer, an annular conductive layer, etc. By having a footprint (e.g., an outline when viewed from above) that completely surrounds the footprint of portion 176 of the substrate, common gate 144 may prevent leakage from portion 176 of the substrate. The ring-shaped conductive layer 144 may have a central opening that overlaps portion 176 of the substrate. Portion 176 of the substrate may sometimes be referred to as an enclosed diffusion region, an isolated diffusion region, etc. Common gate 144 has a contact 156 that is coupled to common gate signal CG. Additionally, conductive layer 174 (e.g., a metal wire) may couple contact 168 at enclosed diffusion region 176 to contact 170 at overflow capacitor 116. In this way, enclosed diffusion region 176 is electrically connected to overflow capacitor 116. If imaging pixel 34 is implemented using stacked substrates, conductive layer 174 may be a conductive interconnect layer that couples capacitor 116 in a second substrate to enclosed diffusion region 176 in a first substrate.

Portion 184 of common gate 144 may form a gate for dual conversion gain transistor 114. Therefore, when common gate signal CG is provided at a level to assert transistor 114, charge may pass under portion 184 of common gate 144 from enclosed diffusion region 176 (and overflow capacitor 116 via conductive layer 174) to floating diffusion region 106.

Portion 182 of common gate 144 may form a gate for overflow transistor 122. Therefore, when common gate signal CG is provided at a level to assert transistor 122, charge may pass under portion 182 of common gate 144 from photodiode 102 to enclosed diffusion region 176 (and overflow capacitor 116 via conductive layer 174).

Figure 6:
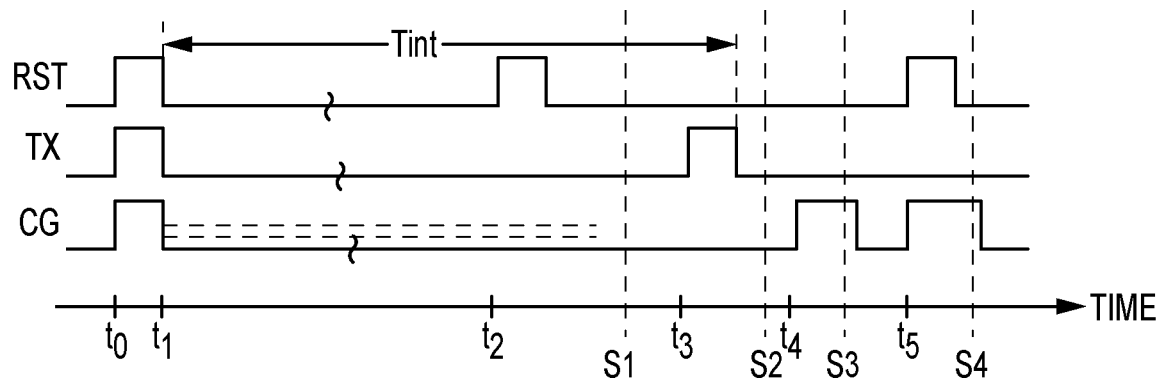
FIGS. 6-9 are timing diagrams showing illustrative methods of operating the imaging pixel of FIGS. 4 and 5 in accordance with an embodiment.

FIG. 6 shows an illustrative timing diagram for operating a pixel of the type shown in FIGS. 4 and 5. As shown in FIG. 6, at to the reset control signal RST, transfer transistor control signal TX, and the common gate control signal CG may be raised high. This results in transfer transistor 104, overflow transistor 122, dual conversion gain transistor 114, and reset transistor 108 all being asserted. When these transistors are asserted, floating diffusion region 106 and capacitor 116 will be reset to a reset voltage and the photodiode 102 will be reset to be empty (i.e., to not hold any charge). At $t_1$ the signals may be lowered to deassert the transistors and begin the integration time $T_{INT}$. Throughout the integration time, the common gate transistor may be optionally set to an intermediate level (represented by the dashed lines in FIG. 6). This intermediate level may be fixed or may include pulsing the common gate transistor between various levels. When at the intermediate level, charge above a given threshold will overflow through transistor 122 to capacitor 116. The threshold at which charge overflows transistor 122 to capacitor 116 may be determined by the intermediate level of the control signal for the gate of transistor 122. The common gate signal may be at the same intermediate level throughout the integration time, may be pulsed between various levels during the integration time, etc.

Next, at $t_2$, the reset control signal may be pulsed to assert reset transistor 108. Asserting the reset transistor may cause the voltage of floating diffusion region 106 to be reset. This reset voltage may then be sampled at sample S1 (e.g., by asserting the row select transistor).

At $t_3$, transfer transistor 104 may be asserted by raising transfer control signal TX. The integration time $T_{INT}$ may end after the assertion of the transfer transistor is completed. Overflow integration time may not end until the overflow charge is read. Asserting transfer transistor 104 may transfer the non-overflow charge from photodiode 102 to floating diffusion region 106. The non-overflow charge may then be sampled at sample S2.

Common gate signal CG may be low for the S1 and S2 samplings, meaning the pixel is in a high conversion gain mode for the S1 and S2 samplings. The S1 signal may therefore sometimes be referred to as a high conversion gain (HCG) reset sample and the S2 signal may sometimes be referred to as a high conversion gain signal sample.

After sample S2, the common gate control signal CG may be raised at $t_4$. Raising the common gate control signal results in overflow transistor 122 and dual conversion gain transistor 114 being asserted. Consequently, charge from overflow capacitor 116 (e.g., the overflow charge that has overflowed past transistor 122 during the integration time) is shared with floating diffusion region 106. While the common gate control signal is high, the floating diffusion (which includes overflow charge and non-overflow charge) may be sampled at sample S3.

After sample S3, the common gate signal may be lowered. Then, at $t_5$, both the common gate signal and the reset signal may be raised. This causes reset transistor 108, dual conversion gain transistor 114, and overflow transistor 122 to be asserted. As a result, the floating diffusion region 106 and storage capacitor 116 are reset to a reset voltage. The reset voltage is then sampled at sample S4 in a low conversion gain mode (because CG is high during S4).

Common gate signal CG may be high for the S3 and S4 samplings, meaning the pixel is in a low conversion gain mode for the S3 and S4 samplings. The S3 signal may therefore sometimes be referred to as a low conversion gain (LCG) signal sample and the S4 signal may sometimes be referred to as a low conversion gain reset sample. The S1 sample may be used to correct the S2 sample in a correlated double sampling technique. The S4 sample may be used to correct the S3 sample in an uncorrelated double sampling technique.

The timing diagram of FIG. 6 is merely illustrative. Numerous other timing diagrams may be used to operate the pixel of FIGS. 4 and 5. For example, in FIG. 6 the floating diffusion region is reset at $t_2$ (before S1) and at $t_5$ (before S4). However, the floating diffusion region may instead be reset before S1, before S3, and before S4. An example of this type is shown in FIG. 7.

Figure 7:
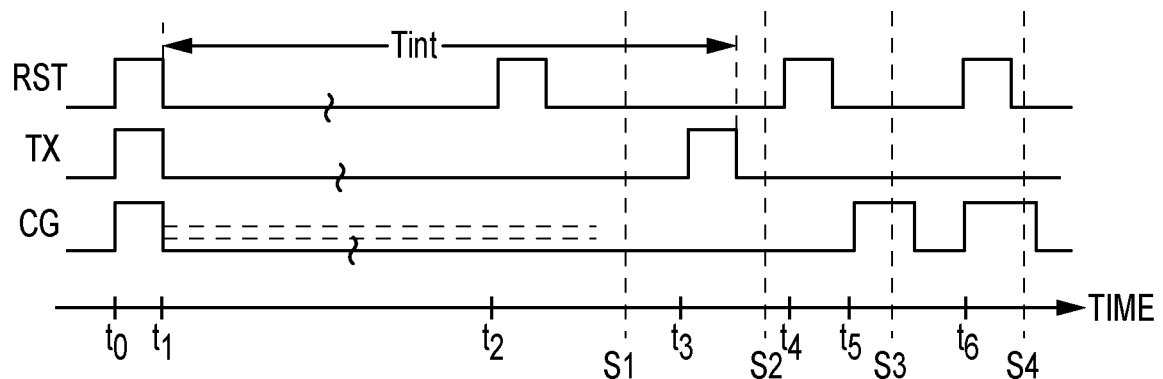

As shown in FIG. 7 at to the reset control signal RST, transfer transistor control signal TX, and the common gate control signal CG may be raised high. This results in transfer transistor 104, overflow transistor 122, dual conversion gain transistor 114, and reset transistor 108 all being asserted. When these transistors are asserted, the floating diffusion region 106 and capacitor 116 will be reset to a reset voltage and the photodiode 102 will be reset to be empty (i.e., to not hold any charge). At $t_1$ the signals may be lowered to deassert the transistors and begin the integration time $T_{INT}$. Throughout the integration time, the common gate transistor may be optionally set to an intermediate level (represented by the dashed lines in FIG. 7). This intermediate level may be fixed or may include pulsing the common gate transistor between various levels. When at the intermediate level, charge above a given threshold will overflow through transistor 122 to capacitor 116. The common gate signal may be at the same intermediate level throughout the integration time, may be pulsed between various levels during the integration time, etc.

Next, at $t_2$, the reset control signal may be pulsed to assert reset transistor 108. Asserting the reset transistor may cause the voltage of floating diffusion region 106 to be reset. This reset voltage may then be sampled at sample S1 (e.g., by asserting the row select transistor).

At $t_3$, transfer transistor 104 may be asserted by raising transfer control signal TX. The integration time $T_{INT}$ may end when the assertion of the transfer transistor is completed. Overflow integration time may not end until the overflow charge is read. Asserting transfer transistor 104 may transfer the non-overflow charge from photodiode 102 to floating diffusion region 106. The non-overflow charge may then be sampled at sample S2.

Common gate signal CG may be low for the S1 and S2 samplings, meaning the pixel is in a high conversion gain mode for the S1 and S2 samplings. The S1 signal may therefore sometimes be referred to as a high conversion gain (HCG) reset sample and the S2 signal may sometimes be referred to as a high conversion gain signal sample. After sample S2, the reset transistor may again be asserted at $t_4$. This resets the floating diffusion region and clears the floating diffusion region of the non-overflow charge.

The common gate control signal CG may be raised at $t_5$. Raising the common gate control signal results in overflow transistor 122 and dual conversion gain transistor 114 being asserted. Consequently, charge from overflow capacitor 116 (e.g., the overflow charge that has overflowed past transistor 122 during the integration time) is shared with floating diffusion region 106. While the common gate control signal is high, the floating diffusion (which includes overflow charge only) may be sampled at sample S3.

After sample S3, the common gate signal may be lowered. Then, at $t_5$, both the common gate signal and the reset signal may be raised. This causes reset transistor 108, dual conversion gain transistor 114, and overflow transistor 122 to be asserted. As a result, the floating diffusion region 106 and storage capacitor 116 are reset to a reset voltage. The reset voltage is then sampled at sample S4 in a low conversion gain mode (because CG is high during S4).

Common gate signal CG may be high for the S3 and S4 samplings, meaning the pixel is in a low conversion gain mode for the S3 and S4 samplings. The S3 signal may therefore sometimes be referred to as a low conversion gain (LCG) signal sample and the S4 signal may sometimes be referred to as a low conversion gain reset sample.

Figure 8:
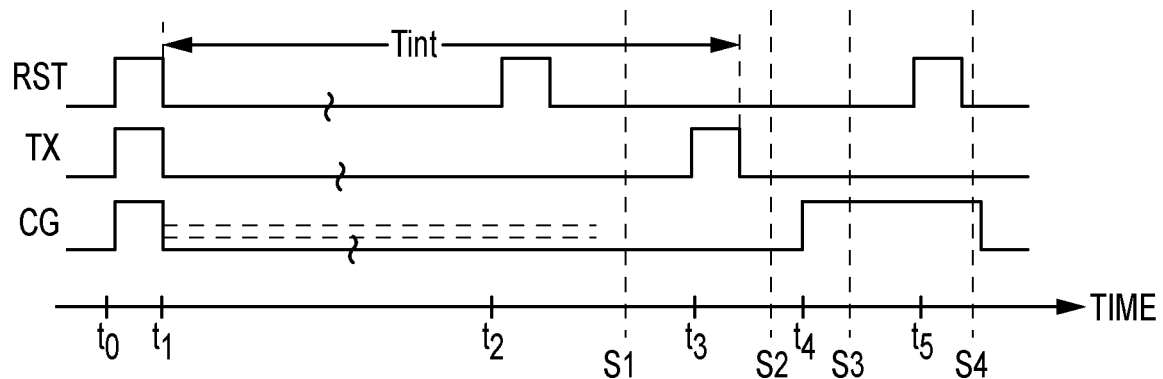

In another illustrative timing diagram, shown in FIG. 8, the operation of the pixel is the same as in FIG. 6, except for control of the common gate signal CG between $t_4$ and $t_5$. In FIG. 8, as in FIG. 6, the common gate control is raised for sample S3 at $t_4$. However, in FIG. 6 CG is dropped low after S3 and raised again at is before the S4 sampling. In FIG. 8, in contrast, CG remains high after the S3 sampling, through $t_5$ and the S4 sampling.

Figure 9:
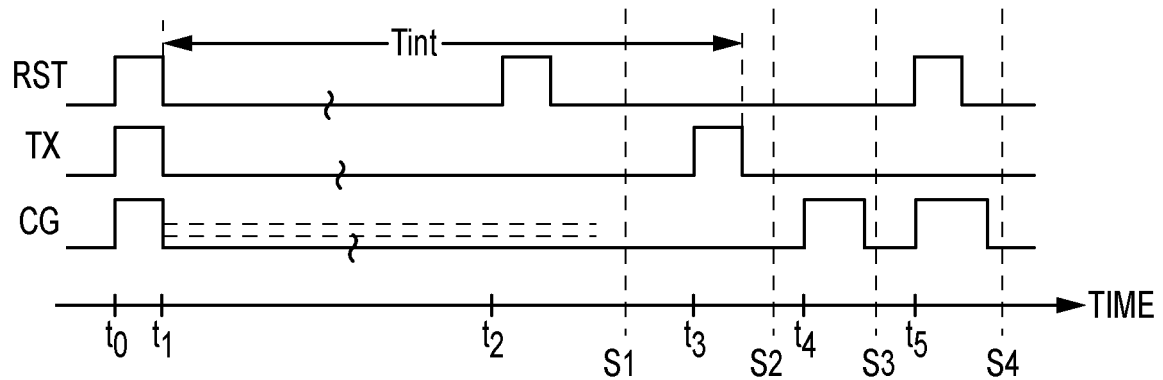

FIG. 9 shows yet another illustrative timing diagram for operation of the pixels of FIGS. 4 and 5. Operation of the pixel as shown in FIG. 9 is the same as in FIG. 6, except for the timing of the S3 and S4 sampling. In FIG. 6, the S3 and S4 samples are both taken when common gate signal CG is high. In other words, S3 and S4 are taken in the low conversion gain mode in FIG. 6. In contrast, in FIG. 9, the S3 and S4 samples are taken after the common gate signal is lowered. Consequently, the dual conversion gain transistor is not asserted during the sampling and the pixel is in the high conversion gain mode for the S3 and S4 samples. This type of operation may be noisier than the operation in FIG. 6, but may have improved dark level control.

In FIGS. 4 and 5, an example was shown where overflow transistor 122 is used as a barrier for charge overflowing from photodiode 102. Charge exceeding a certain level passes through overflow transistor 122 to capacitor 116. However, other types of barriers may be used between photodiode 102 and capacitor 116 for this purpose.

Figure 10:
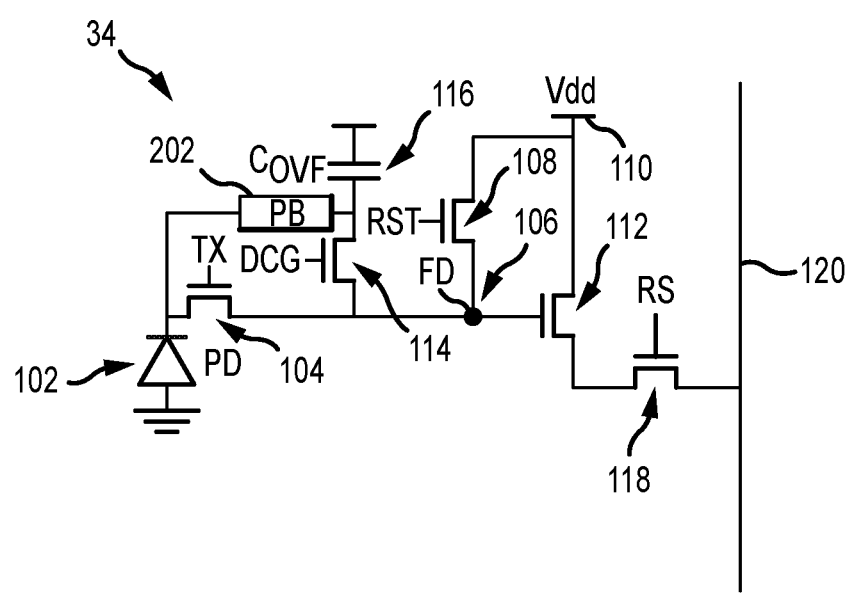
FIG. 10 is a circuit diagram of an illustrative imaging pixel having a potential barrier between a photodiode and an overflow capacitor in accordance with an embodiment.

FIG. 10 is a circuit diagram of an illustrative pixel 34 that has a controlled potential barrier 202 (sometimes referred to as a photobarrier) interposed between photodiode 102 and capacitor 116. Charge above a certain threshold will exceed the potential barrier 202 and overflow photodiode 102 to capacitor 116. The rest of the pixel has a similar structure to the pixel of FIG. 4, with a dual conversion gain transistor 114 interposed between the capacitor 116 and floating diffusion region 106, a reset transistor interposed between the floating diffusion region 106 and bias voltage supply terminal 110, source follower transistor 112 having a gate coupled to floating diffusion region 106, and a row select transistor coupled between the source follower transistor and a column output line 120. The dual conversion gain transistor 114 in FIG. 10 receives a dedicated dual conversion gain control signal DCG (instead of a signal that is shared between two transistors as in FIG. 4).

Figure 11:
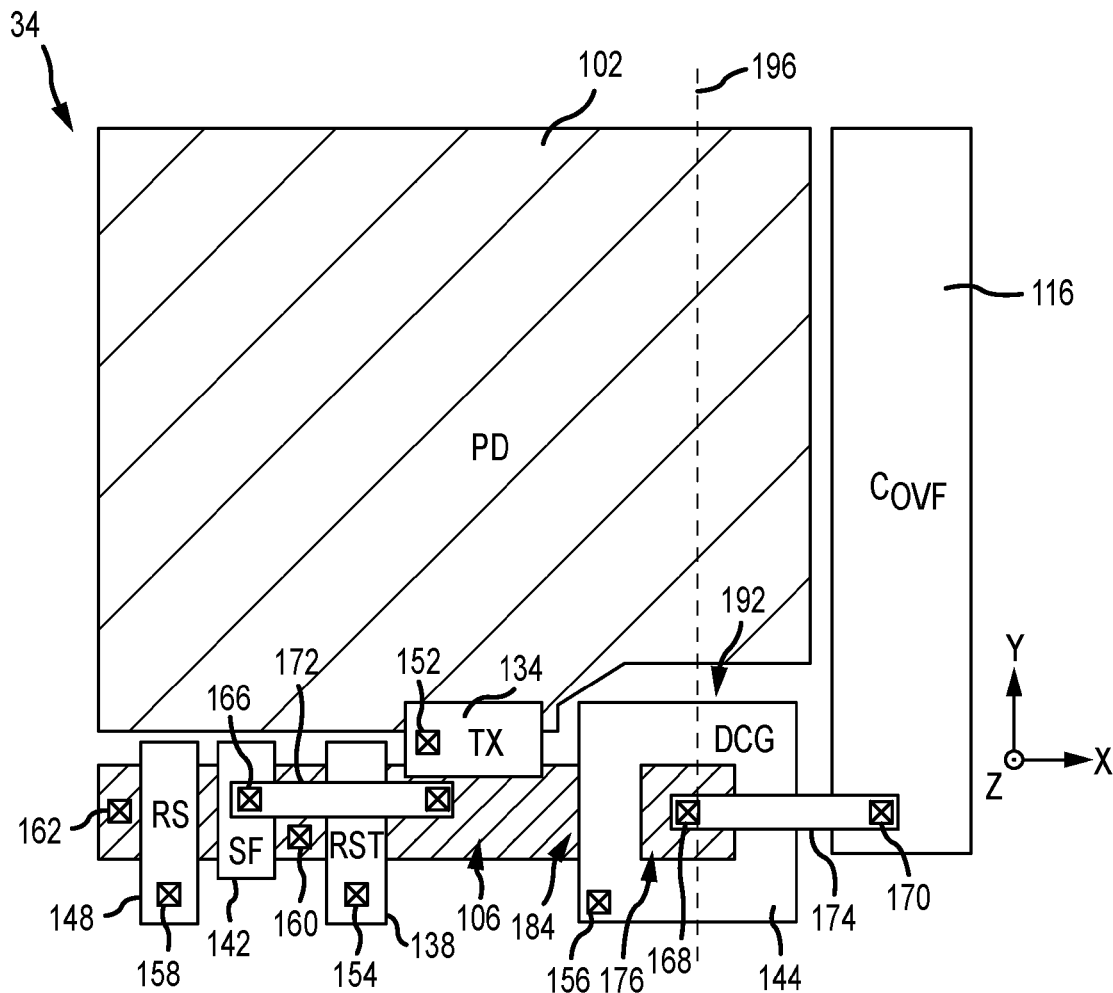
FIG. 11 is a top view of the illustrative imaging pixel of FIG. 10 showing how the gate for the dual conversion gain transistor may be ring-shaped in accordance with an embodiment.

The gate for transistor 114 of FIG. 10 may still be ring-shaped, as shown in FIG. 11. FIG. 11 is a top view of the imaging pixel of FIG. 10. The layout of the pixel shown in FIG. 11 is similar to the layout of the pixel shown in FIG. 5. As shown in FIG. 11, the imaging pixel includes a photodiode 102. Similar to as shown in FIG. 5, the pixel of FIG. 11 includes a gate 144 that completely laterally surrounds a portion 176 of the substrate. Gate 144 may sometimes be described herein as a ring-shaped gate, a circular gate, an annular gate, a ring-shaped conductive layer, a circular conductive layer, an annular conductive layer, etc. By completely surrounding portion 176 of the substrate, gate 144 may prevent leakage from portion 176 of the substrate. Portion 176 of the substrate may sometimes be referred to as an enclosed diffusion region, an isolated diffusion region, etc. Gate 144 has a contact 156 that is coupled to dual conversion gain signal DCG. Additionally, conductive layer 174 (e.g., a metal wire) may couple contact 168 at enclosed diffusion region 176 to contact 170 at overflow capacitor 116. In this way, enclosed diffusion region 176 is electrically connected to overflow capacitor 116.

Portion 184 of common gate 144 may form a gate for dual conversion gain transistor 114. Therefore, when dual conversion gain signal DCG is provided at a level to assert transistor 114, charge may pass under portion 184 of common gate 144 from enclosed diffusion region 176 (and overflow capacitor 116 via conductive layer 174) to floating diffusion region 106.

To prevent charge from undesirably leaking from photodiode 102 to enclosed diffusion region 176 (or vice versa), the photodiode may have a recess 192. Gate 144 therefore does not overlap photodiode 102. This is in contrast to FIG. 5, where gate 144 does overlap photodiode 102.

Figure 12:
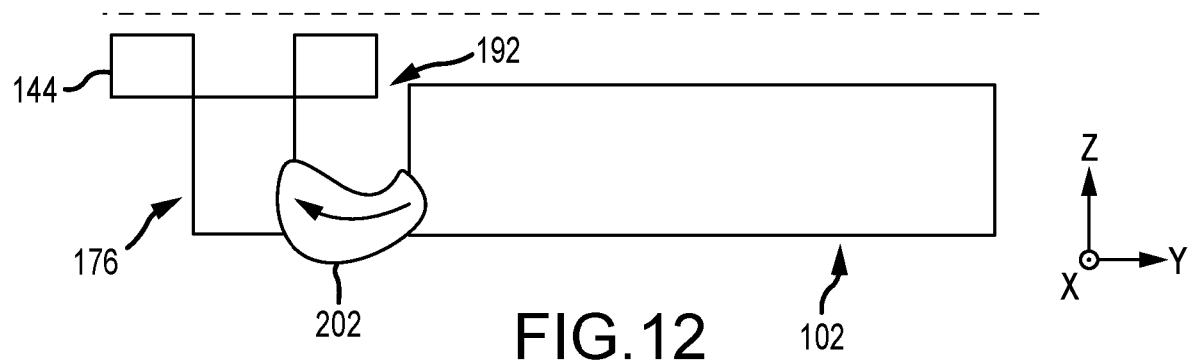
FIG. 12 is a cross-sectional side view of the illustrative imaging pixel of FIGS. 10 and 11 showing the potential barrier between the photodiode and an enclosed diffusion region that is connected to the overflow capacitor in accordance with an embodiment.

FIG. 12 is a cross-sectional side view of pixel 34 taken along line 196 in FIG. 11. FIG. 12 shows how charge over a certain threshold may pass through potential barrier 202 from photodiode 102 to enclosed diffusion region 176. Gate 144 surrounds enclosed diffusion region 176 to prevent leakage from enclosed diffusion region 176. Gate 144 does not overlap photodiode 102. There is a gap 192 between the edge of gate 144 and the edge of photodiode 102.

The foregoing is merely illustrative of the principles of this invention and various modifications can be made by those skilled in the art. The foregoing embodiments may be implemented individually or in any combination.

What is claimed is:

1. An imaging pixel comprising:
    a photodiode configured to generate charge in response to incident light;
    an overflow capacitor;
    a first transistor that is configured to allow charge above a given threshold to overflow from the photodiode to the overflow capacitor;
    a floating diffusion region;
    a second transistor that is interposed between the overflow capacitor and the floating diffusion region; and
    a ring-shaped conductive layer that forms a gate for the first transistor and a gate for the second transistor.

2. The imaging pixel defined in claim 1, further comprising:
    a transfer transistor that is configured to transfer charge from the photodiode to the floating diffusion region.

3. The imaging pixel defined in claim 2, further comprising:
    an enclosed diffusion region, wherein the ring-shaped conductive layer has a central opening that overlaps the enclosed diffusion region.

4. The imaging pixel defined in claim 3, further comprising:
    a conductive layer that electrically connects the enclosed diffusion region to the overflow capacitor.

5. The imaging pixel defined in claim 4, wherein a first portion of the ring-shaped conductive layer is interposed between the enclosed diffusion region and the photodiode and a second portion of the ring-shaped conductive layer is interposed between the enclosed diffusion region and the floating diffusion region.

6. The imaging pixel defined in claim 5, wherein the first portion of the ring-shaped conductive layer forms the gate for the first transistor and the second portion of the ring-shaped conductive layer forms the gate for the second transistor.

7. The imaging pixel defined in claim 6, further comprising:
    a bias voltage supply terminal contact; and
    a reset transistor, wherein the reset transistor has a gate that is interposed between the floating diffusion region and the bias voltage supply terminal contact.

8. The imaging pixel defined in claim 7, further comprising:
    a source follower transistor having a gate;
    an additional conductive layer that electrically connects the floating diffusion region to the gate of the source follower transistor;
    a column output line;
    an output contact coupled to the column output line;
    a row select transistor having a gate that is interposed between the gate of the source follower transistor and the output contact; and
    a control path that is configured to provide a single control signal to the ring-shaped conductive layer.

9. An imaging pixel comprising:
    a photodiode configured to generate charge in response to incident light;
    a floating diffusion region;
    a transfer transistor interposed between the photodiode and the floating diffusion region;
    an isolated diffusion region overlapped by a central opening of a ring-shaped gate;
    a first transistor interposed between the photodiode and the isolated diffusion region, wherein a first portion of the ring-shaped gate forms a gate for the first transistor; and
    a second transistor interposed between the isolated diffusion region and the floating diffusion region, wherein a second portion of the ring-shaped gate forms a gate for the second transistor.

10. The imaging pixel defined in claim 9, further comprising:
    a storage capacitor that is coupled to the isolated diffusion region by a conductive layer.

11. The imaging pixel defined in claim 10, wherein the photodiode is configured to generate the charge in response to incident light during an integration time and wherein the first transistor is configured to allow charge to overflow from the photodiode to the isolated diffusion region during the integration time.

12. The imaging pixel defined in claim 11, wherein the second transistor is configured to couple the storage capacitor to the floating diffusion region.

13. The imaging pixel defined in claim 9, wherein the isolated diffusion region is isolated from the floating diffusion region by the ring-shaped gate.

14. The imaging pixel defined in claim 9, wherein the first transistor is an overflow transistor and the second transistor is a dual conversion gain transistor.

15. The imaging pixel defined in claim 9, wherein the gate for the first transistor and the gate for the second transistor receive a common control signal that is provided to the ring-shaped gate by a control path that is coupled to the ring-shaped gate.

16. An imaging pixel comprising:
    a semiconductor substrate;
    a photodiode in the semiconductor substrate;
    a floating diffusion region in the semiconductor substrate;
    an enclosed diffusion region in the semiconductor substrate;
    a first gate, wherein the first gate and the semiconductor substrate are overlapping and the first gate is interposed between the photodiode and the floating diffusion region;
    a second gate that is ring-shaped, wherein the second gate and the semiconductor substrate are overlapping, wherein a portion of the second gate is interposed between the enclosed diffusion region and the floating diffusion region, and wherein the enclosed diffusion region is overlapped by a central opening of the second gate;

a potential barrier in the semiconductor substrate interposed between the photodiode and the enclosed diffusion region; and a capacitor that is electrically connected to the enclosed diffusion region.

17. The imaging pixel defined in claim 16, wherein the photodiode is configured to generate charge during an integration time and wherein the potential barrier is configured to allow some of the generated charge to overflow from the photodiode to the enclosed diffusion region.

18. The imaging pixel defined in claim 16, wherein a gap is present between the photodiode and the second gate.

19. The imaging pixel defined in claim 16, wherein the first gate is a transfer gate that is formed separately from the second gate.

* * * * *